(12) United States Patent
Park et al.

(10) Patent No.: US 7,608,547 B2
(45) Date of Patent: *Oct. 27, 2009

(54) ETCHANT AND METHOD FOR FABRICATING LIQUID CRYSTAL DISPLAY USING THE SAME

(75) Inventors: Hong-sick Park, Suwon-si (KR); Shi-yul Kim, Yongin-si (KR); Jong-hyun Choung, Suwon-si (KR); Won-suk Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 379 days.

This patent is subject to a terminal disclaimer.

(21) Appl. No.: 11/486,477

(22) Filed: Jul. 13, 2006

(65) Prior Publication Data

US 2007/0167025 A1  Jul. 19, 2007

(30) Foreign Application Priority Data

Jul. 13, 2005  (KR) ............... 10-2005-0063345

(51) Int. Cl.
*H01L 21/302* (2006.01)
*H01L 21/461* (2006.01)

(52) U.S. Cl. ............... 438/745; 438/754; 216/83; 216/84; 216/100; 216/101; 216/105

(58) Field of Classification Search .......... 438/745, 438/754

See application file for complete search history.

(56) References Cited

U.S. PATENT DOCUMENTS

| | | | |
|---|---|---|---|
| 6,632,115 B1 | 10/2003 | Tsujimura et al. | |
| 6,818,142 B2 * | 11/2004 | Tufano et al. | 216/83 |
| 7,229,569 B1 * | 6/2007 | Seki et al. | 252/79.1 |
| 7,329,365 B2 * | 2/2008 | Cho et al. | 216/83 |

FOREIGN PATENT DOCUMENTS

| | | |
|---|---|---|
| CN | 1465746 A1 | 1/2004 |
| JP | 10-178177 | 6/1998 |
| JP | 2000-8184 | 1/2000 |
| WO | 2004/089717 A1 | 10/2004 |

OTHER PUBLICATIONS

Patent Abstracts of Japan, Publication No. 10-178177, Jun. 30, 1998, 1 p.
Patent Abstracts of Japan, Publication No. 2000-008184, Jan. 11, 2000, 1 p.
CN Office Action of Mar. 13, 2009 for Application No. 200610099011.5.

* cited by examiner

*Primary Examiner*—Duy-Vu N Deo
(74) *Attorney, Agent, or Firm*—Innovation Counsel LLP

(57) ABSTRACT

Provided are an etchant used for a transparent conductive oxide layer and a method for fabricating a liquid crystal display (LCD) using the etchant. The etchant includes 2-5 wt % sulfuric acid, 0.02-10 wt % hydrogen sulfate of alkali metal, and deionized water as the remainder.

27 Claims, 13 Drawing Sheets

ETCHANT AND METHOD FOR FABRICATING LIQUID CRYSTAL DISPLAY USING THE SAME

REFERENCE TO OTHER APPLICATIONS

This application claims priority from Korean Patent Application No. 10-2005-0063345 filed on Jul. 13, 2005, in the Korean Intellectual Property Office, the disclosure of which is incorporated herein by reference in its entirety.

FIELD OF THE INVENTION

The present invention relates to an etchant and a method for fabricating a liquid crystal display (LCD) using the same, and more particularly, to an etchant used for patterning a transparent conductive oxide layer and a method for fabricating an LCD using the same.

BACKGROUND OF THE INVENTION

A liquid crystal display (LCD), which is one of the most widely used flat panel displays, includes two plates having electrodes and a liquid crystal layer interposed between the plates. Voltages applied to the electrodes rearrange the liquid crystal molecules, thereby adjusting the transmitted amount of incident light. In various kinds of LCDs, a plurality of pixel electrodes are arranged in a matrix form at one of the two plates and a common electrode covers the entire surface of the other plate. The field generating electrodes may be formed by patterning a transparent conductive oxide layer made, for example, of indium oxide, indium tin oxide (ITO) or indium zinc oxide (IZO). When a transparent conductive oxide layer comprising ITO is annealed to crystallize the ITO and then patterned, an etchant containing strong acid such as ferric chloride or aqua regia is used. However, such an aqua regia based etchant may damage an underlying layer. Further, during a high-temperature process, a large amount of the etchant may be evaporated adversely altering the composition of the etchant and also contaminating the working environment.

Instead of annealing the transparent conductive oxide ITO layer to make it crystalline before patterning it to make a field electrode, an amorphous ITO coating may first be patterned using an etchant including oxalic acid and then annealed to form the field electrode. An oxalic acid based etchant offers high etching speed even at low temperature without damaging an underlying Cr, Al, or Mo layer. However, the oxalic acid based etchant is prepared by dissolving solid oxalic acid into water but oxalic acid has low water solubility and does not dissolve easily. As a result, oxalic acid deposits may be formed on pipes, nozzles, valves, or pumps, thus shortening the life span of a device or causing it to malfunction. Alternative etchants based on aqua regia or ferric chloride may be employed but these too may damage an underlying layer, sustain a change in the composition or contaminate the working environment.

SUMMARY OF THE INVENTION

The present invention provides an improved etchant and method for fabricating LCD for patterning a transparent conductive oxide layer that has wider application depending on the transparent conductive oxide layer and that does not damage underlying layers. According to an aspect of the present invention, there is provided an etchant for a transparent conductive oxide layer that includes 2-15 wt % sulfuric acid, 0.02-10 wt % hydrogen sulfate of alkali metal, and deionized water as the remainder. According to another aspect of the present invention, the etchant may include the foregoing together with a 0.02-10 wt % auxiliary oxidizer NS and a 0.01-5 wt % auxiliary inhibitor with deionized water as the remainder.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
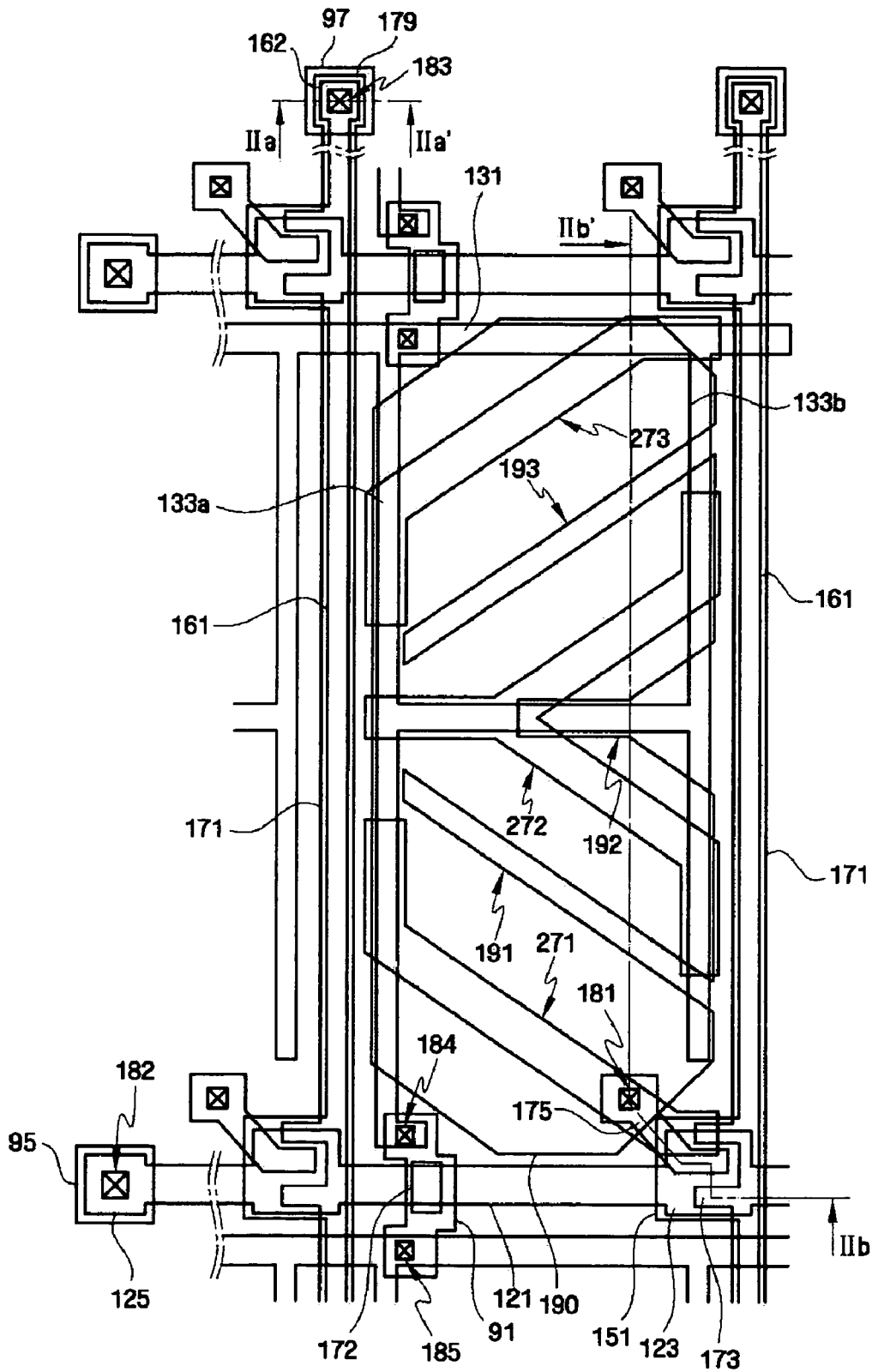
FIG. 1 is a layout of a liquid crystal display (LCD) fabricated according to an embodiment of the present invention.

An etchant for a transparent conductive oxide layer according to an embodiment of the present invention, which will be simply referred to as an etchant hereinafter, includes sulfuric acid ($H_2SO_4$), alkali metal hydrogen sulfate, and water. Sulfuric acid exhibits strong acidity in an aqueous solution and serves as the main oxidizer for etching transparent conductive oxide layers formed of indium oxide, e.g., ITO or IZO. As noted above, an ITO layer when annealed may have a crystalline structure, whereas when not annealed, it may have an amorphous structure. Sulfuric acid comprising 2-15 wt % of the total amount of the etchant is exemplary. Since sulfuric acid has strong acidity in an aqueous solution, it is capable of etching an ITO layer or an IZO layer, without regard to whether the ITO layer has a crystalline structure or an amorphous structure.

Using a hydrogen sulfate of alkali metal provides an etchant with superior etching capability while preventing damage to underlying layers, e.g., a metal layer. Potassium hydrogen sulfate ($KHSO_4$) may be used as the hydrogen sulfate of alkali metal and the amount of hydrogen sulfate of alkali-metal contained in the etchant may be in a range of 0.02-10 wt %.

The etchant according to an embodiment of the present invention may also include an auxiliary oxidizer for aiding the action of the sulfuric acid. The auxiliary oxidizer may be a compound of at least one selected from the group consisting of phosphoric acid ($H_3PO_4$), nitric acid ($HNO_3$), acetic acid ($CH_3COOH$), perchloric acid ($HClO_4$), hydrogen peroxide ($H_2O_2$), and oxone. The amount of the auxiliary oxidizer contained in the etchant may be in a range of 0.02-10 wt %.

The etchant according to an embodiment of the present invention may also include an inhibitor (hereinafter will be briefly referred to as an auxiliary inhibitor) for aiding the action of the hydrogen sulfate of alkali metal in preventing damage to an underlying layer while providing superior etching capability with respect to the transparent conductive oxide layer. The auxiliary inhibitor may be a compound of at least one selected from the group consisting of ammonium salts, i.e., $CH_3COONH_4$, $NH_4SO_3NH_2$, $NH_4C_6H_5O_2$, $NH_4COONH_4$, $NH_4Cl$, $NH_4H_2PO_4$, $NH_4OOCH$, $NH_4HCO_3$, $H_4NO_2CCH_2C(OH)(CO_2NH_4)$ $CH_2CO_2NH_4$, $NH_4PF_6$, $HOC(CO_2H)(CH_2CO_2NH_4)_2$, $NH_4NO_3$, $(NH_4)_2S_2O_8$, $H_2NSO_3NH_4$, and $(NH_4)_2SO_4$. The amount of the auxiliary inhibitor may be in a range of 0.01-5 wt % with respect to a total amount of the etchant.

The etchant according to an embodiment of the present invention may also include an additive that is conventionally used in the art to improve etching performance. The additive may be, but is not limited to, a surfactant, a sequestering agent, and a corrosion inhibitor. The surfactant is used to increase etching uniformity by reducing surface tension. For example, an anionic surfactant, a cationic surfactant, a bi-ionic surfactant, or a non-ionic surfactant may be used or, for example, a fluoric surfactant may be used. The sequestering agent is used to prevent deposition of a metal ion in the etchant. For example, the sequestering agent may be derivatives of polycarboxylic acid, amino acetic acid, or nitrilotriacetic acid. A corrosion inhibitor is used to prevent corrosion of an underlying layer formed of metal. For example, the corrosion inhibitor may be chromate, phosphate, or silicate. Here, the amount of the additive may be in a range of 0.0001-0.01 wt % with respect to a total amount of the etchant. To improve etching performance of the etchant according to an embodiment of the present invention, various additives known in the art may be used.

The etchant according to an embodiment of the present invention includes water as the remainder except for the substances, i.e., sulfuric acid, hydrogen sulfate of alkali metal, the auxiliary oxidizer, the auxiliary inhibitor, and/or the additive. The total amount of the etchant is 100 wt %. The water may be, but not limited to, deionized water having a resistivity of 18 MΩ/cm in a state where ions are removed from water. To prepare the etchant, sulfuric acid, hydrogen sulfate of alkali metal, the auxiliary oxidizer, the auxiliary inhibitor, and/or the additive may be mixed into water such as deionized water, or solutions of those substances are previously made and are then mixed. However, an etchant fabricating method and a mixing order are not particularly specified.

Figure 2:
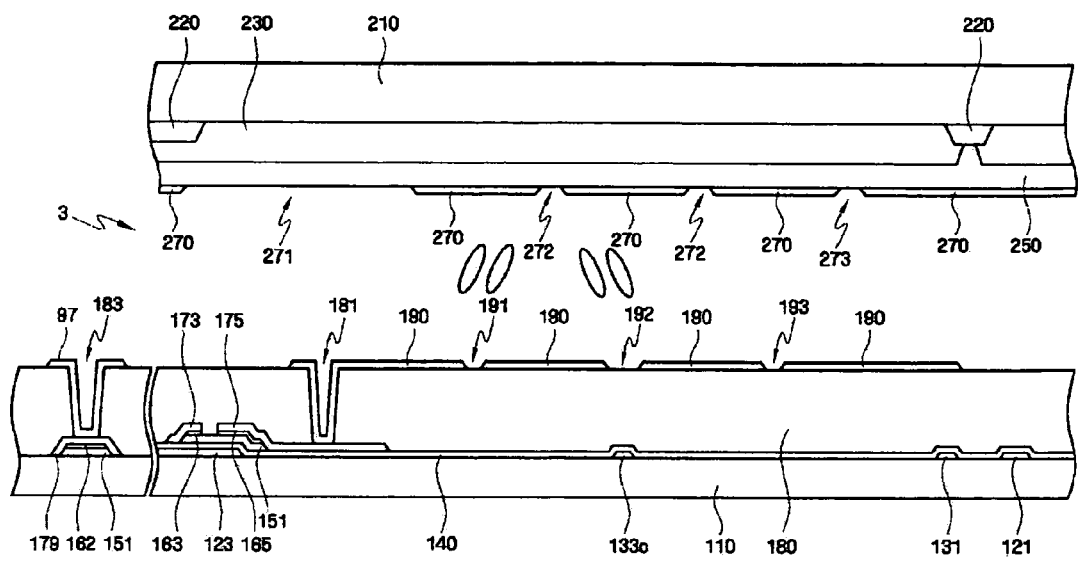
FIG. 2 is a cross-sectional view taken along lines IIa-IIa' and IIb-IIb' of FIG. 1.

Hereinafter, a method for fabricating an LCD using the etchant according to an embodiment of the present invention will be described. First, an LCD fabricated according to an embodiment of the present invention will be described with reference to FIGS. 1 and 2. FIG. 1 is a layout of a liquid crystal display (LCD) fabricated according to an embodiment of the present invention, and FIG. 2 is a cross-sectional view taken along lines IIa-IIa' and IIb-IIb' of FIG. 1. The LCD includes a first substrate 110, a second substrate 210 opposite to the first substrate 110, and a liquid crystal layer 3 including liquid crystal molecules that are inserted between the first substrate 110 and the second substrate 210 and are arranged perpendicularly to the first substrate 110 and the second substrate 210.

Pixel electrodes 190 that are field generating electrodes formed of a transparent conductive oxide material such as crystalline or amorphous ITO or IZO and having cutouts 191, 192, and 193 are formed on the first substrate 110 comprising a transparent insulating material such as glass. Each of the pixel electrodes 190 is connected to a thin film transistor (TFT) and an image signal voltage is applied to each of the pixel electrodes 190. Here, the TFT is connected to a gate line 121 that transmits a scanning signal and a data line 171 that transmits an image signal to turn on or off the pixel electrodes 190. A lower polarizer (not shown) is adhered under the first substrate 110. Here, in the case of a reflective LCD, the pixel electrodes 190 may not comprise a transparent material and a lower polarizer may not be necessary. A black matrix 220 for preventing leakage of light, a red/green/blue (RGB) color filter 230, and a common electrode 270 that is a field generating electrode formed of a transparent conductive oxide material such as crystalline or amorphous ITO or IZO are formed under the second substrate 210 formed of a transparent insulating material such as glass. Here, cutouts 271, 272, and 273 are formed in the common electrode 270. The black matrix 220 may be formed not only along the circumference of a pixel region but also in an overlapping region with the cutouts 271, 272, and 273 of the common electrode 270, thereby preventing leakage of light caused by the cutouts 271, 272, and 273.

Hereinafter, the LCD fabricated according to an embodiment of the present invention will be described in more detail. A gate wiring formed on the first substrate 110 includes a gate line 121 extending in a transverse direction, a gate pad 125 that is connected to the end of the gate line 121 to receive a gate signal from the outside and transmits the same to the gate line 121, and a gate electrode 123 of a protruding TFT that is connected to the gate line 121. The gate wiring also includes a storage electrode line 131 formed in parallel with the gate line 121 and two storage electrodes 133a and 133b that are connected to the storage electrode line 131 and are connected to each other by a horizontal storage electrode 133c. The storage electrode line 131 and the storage electrodes 133a, 133b, and 133c may vary in their shapes and arrangements and may not be formed when there is sufficient storage capacitance occurring due to overlapping of the pixel electrodes 190 and the gate line 121.

The gate wiring may have a single-layered structure of a conductive layer comprising aluminum based metal such as aluminum (Al) or an aluminum alloy or a multi-layered structure (not shown) of the conductive layer and another conductive layer comprising chrome (Cr), titanium (Ti), tantalum (Ta), molybdenum (Mo), and an alloy thereof that have superior physical, chemical, and electrical contact characteristics with respect to other materials such as ITO or IZO on the conductive layer. A gate insulating layer 140 is formed of silicon nitride (SiNx) on the first substrate 110 and the gate wiring. A data wiring is formed on the gate insulating layer 140. The data wiring includes a data line 171 that is formed in a longitudinal direction and intersects the gate line 121 to define a pixel, a source electrode 173 that is a branch of the data line 171, a data electrode 175 that is formed adjacent to the source electrode 173, and a data pad 179 at an end of the data line 171. A bridge portion metal element 172 that overlaps with the gate line 121 is formed on the gate insulating layer 140.

The gate wiring may have a single-layered structure of a conductive layer comprising aluminum based metal such as aluminum (Al) or an aluminum alloy or a multi-layered structure (not shown) of the conductive layer and another conductive layer comprising chrome (Cr), titanium (Ti), tantalum (Ta), molybdenum (Mo), and an alloy thereof that have superior physical, chemical, and electrical contact characteristics with respect to other materials such as ITO or IZO on the conductive layer.

A gate insulating layer 140 is formed of silicon nitride (SiNx) on the first substrate 110 and the gate interconnection line. A data interconnection line is formed on the gate insulating layer 140. The data interconnection line includes a data line 171 that is formed in a longitudinal direction and intersects the gate line 121 to define a pixel, a source electrode 173 that is a branch of the data line 171, a data electrode 175 that is formed adjacent to the source electrode 173, and a data pad 179 at an end of the data line 171. A bridge portion metal element 172 that overlaps with the gate line 121 is formed on the gate insulating layer 140. The gate interconnection line may have a single-layered structure of a conductive layer made of aluminum series metal such as aluminum (Al) or an aluminum alloy or a multi-layered structure (not shown) of the conductive layer and another conductive layer made of chrome (Cr), titanium (Ti), tantalum (Ta), molybdenum (Mo), and an alloy thereof that have superior physical, chemical, and electrical contact characteristics with respect to other materials such as ITO or IZO on the conductive layer.

The semiconductor layer 151, used as the channel portion of the TFT, is formed under the source electrode 173 and the drain electrode 175. The data line semiconductor layer 153 that connects with the channel portion semiconductor layer 151 is formed under the data line 171. To reduce contact resistance between the source electrode 173 and the drain electrode 175 and the channel portion semiconductor layer 151, an ohmic contact layer 161 is formed of silicide or n+ amorphous silicon hydride in which an n-type impurity is heavily doped, on the channel portion semiconductor layer 151 and the data line semiconductor layer 153. Undefined reference numeral 162 indicates a data pad ohmic contact layer. A passivation layer 180 is formed of an inorganic insulating material such as silicon nitride or an organic insulating material such as resin on the data line 171. A contact hole 181 that exposes the drain electrode 175 is formed in the passivation layer 180.

The pixel electrodes 190 that are field generating electrodes having the cutouts 191, 192, and 193 are formed on the passivation layer 180. The pixel electrodes 190 are formed using a transparent conductive oxide material such as crystalline or amorphous ITO or IZO. The cutouts 191, 192, and 193 formed in the pixel electrodes 190 include the horizontal cutout 192 that is formed in a transverse direction at a position that separates the pixel electrodes 190 in a longitudinal direction into upper and lower portions and the oblique cutouts 191 and 193 that are obliquely formed respectively in the separated upper and lower portions of the pixel electrodes 190. Here, the oblique cutouts 191 and 193 in the separated upper and lower portions are perpendicular to each other, so as to uniformly distribute a fringe field in every direction.

A storage wiring connection bridge 91 is formed on the passivation layer 180 to connect the storage electrode 133a and the storage electrode line 131 over the gate line 121. The storage wiring connection bridge 91 contacts the storage electrode 133a and the storage electrode line 131 through contact holes 183 and 184 formed over the passivation layer 180 and the gate insulating layer 140. The storage wiring connection bridge 91 overlaps with the bridge portion metal element 172. The storage wiring connection bridge 91 electrically connects the entire storage wiring on the first substrate 110. The storage wiring can be used to repair the gate line 121 or the data line 171, and the bridge portion metal element 172 is formed to complement electrical connection between the gate line 121 and the storage wiring connection bridge 91 when laser is irradiated for the repair.

An auxiliary gate pad 95 and a auxiliary data pad 97 are formed on the passivation layer 180. The auxiliary gate pad 95 is connected to the gate pad 125 through a contact hole 182 formed over the passivation layer 180 and the gate insulating layer 140. The auxiliary gate pad 97 is connected to the data pad 179 through a contact hole 183 formed on the passivation layer 180.

The black matrix 220 for preventing leakage of light is formed on the second substrate 210. The RGB color filter 230 is formed on the black matrix 220. An overcoat layer 250 is formed on the RGB color filter 230 to planarize a step formed by the RGB color filter 230. The common electrode 270 that is a field generating electrode having the cutouts 271, 272, and 273 is formed on the overcoat layer 250. The common electrode 270 is formed of a transparent conductive material such as crystalline or amorphous ITO or IZO.

The cutouts 271, 272, and 273 of the common electrode 270 have the oblique cutouts 191 and 193 interposed therebetween and include oblique portions that are parallel with the oblique cutouts 191 and 193 and refractive potions that overlap with sides of the pixel electrodes 190. Here, the refractive portions are separated into vertical refractive portions and horizontal refractive portions.

A liquid crystal layer 3 having liquid crystal molecules arranged in a longitudinal direction is provided between the TFT plate and the RGB color filter plate. When the TFT plate and the color filter plate are arranged, the cutouts 191, 192, and 193 of the pixel electrodes 190 and the cutouts 271, 272, and 273 of the common electrode 270 divide a pixel region into a plurality of small domains.

Figure 3:
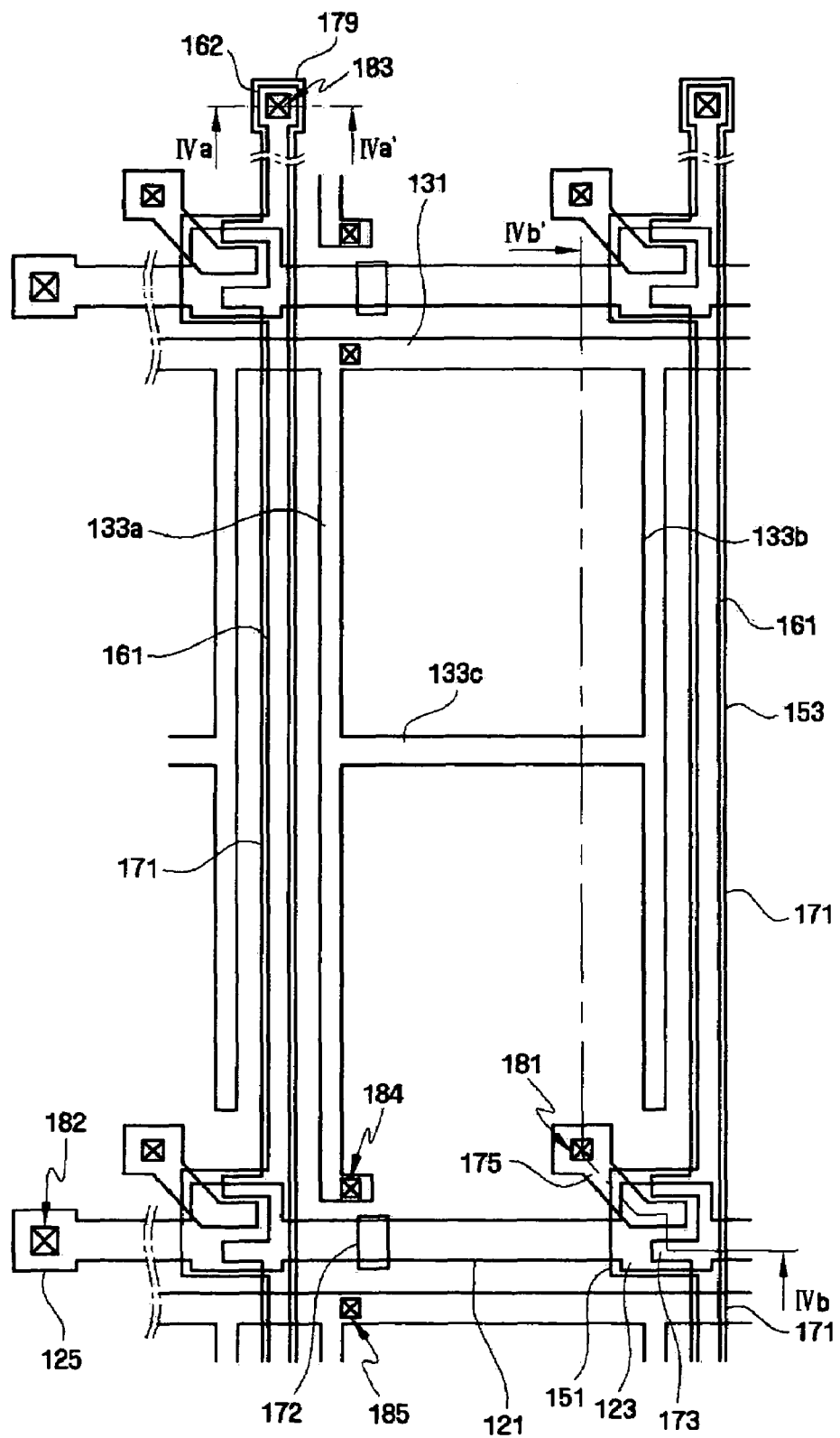
FIG. 3 is a layout of a thin film transistor (TFT) plate of an LCD fabricated according to an embodiment of the present invention.
Figure 4:
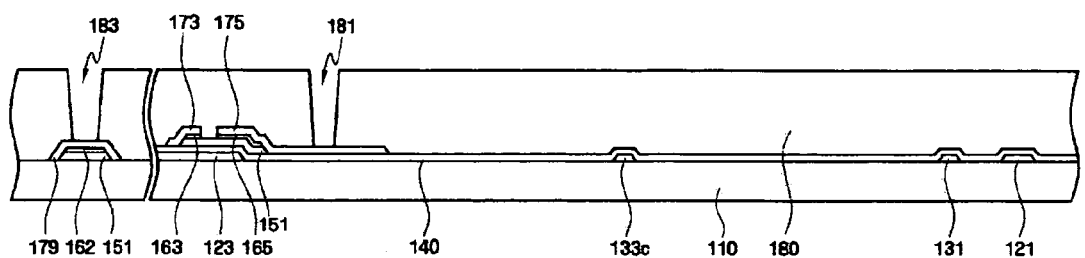
FIGS. 4 and 5 are cross-sectional views taken along lines IVa-IVa' and IVb-IVb' of FIG. 3.
Figure 5:
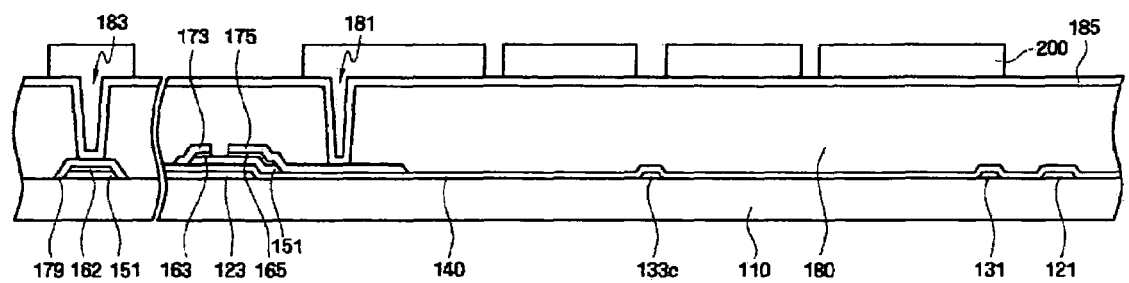
Figure 6:
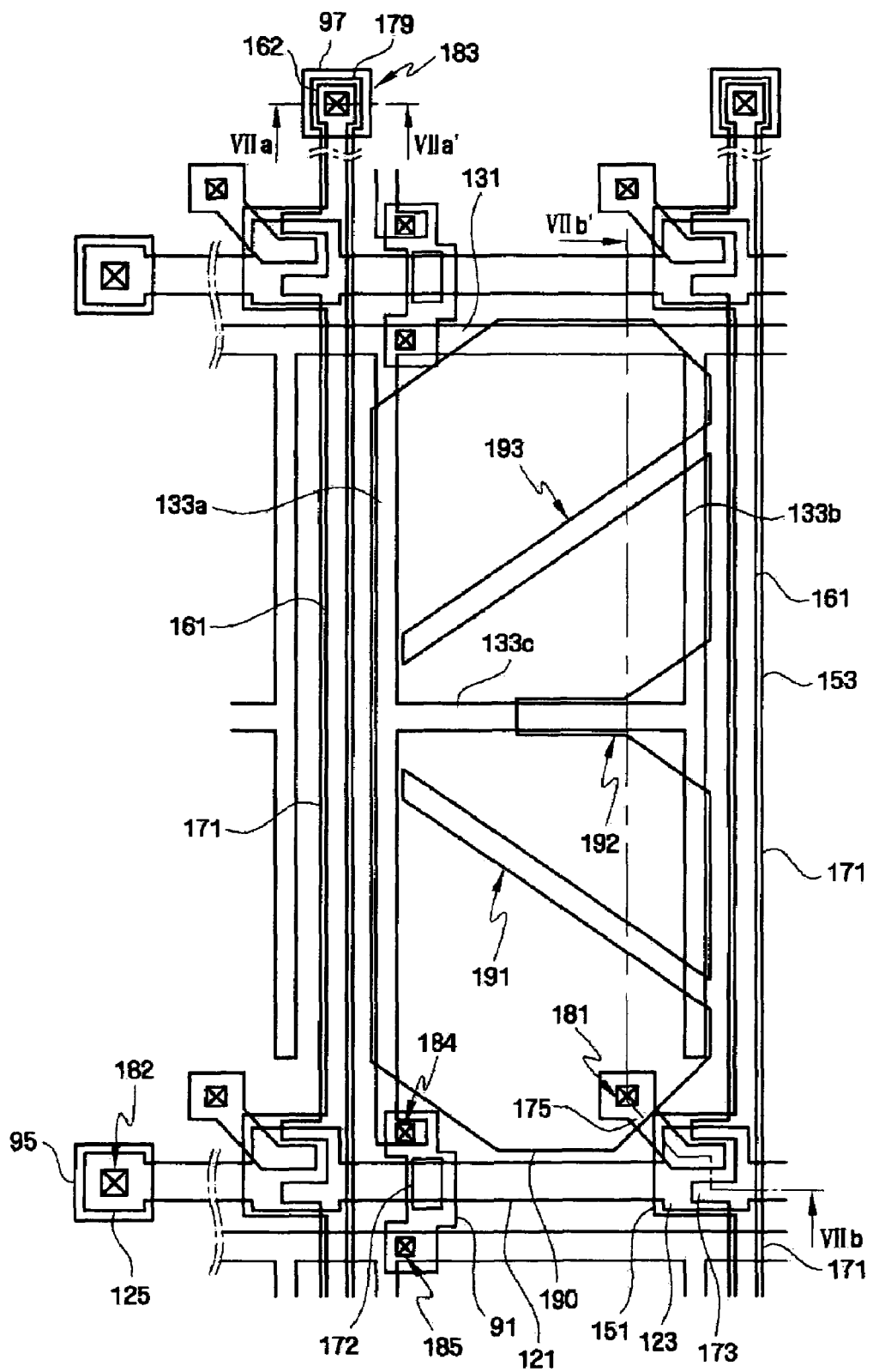
FIG. 6 is a layout of a TFT plate at a stage following FIG. 5.
Figure 7:
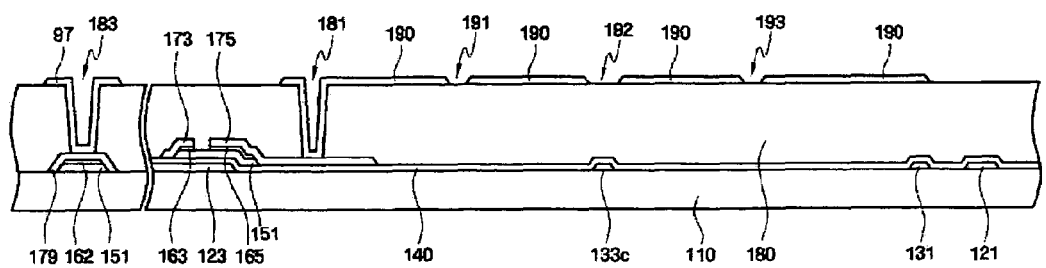
FIG. 7 is a cross-sectional view taken along VIIa-VIIa' and VIIb-VIIb' of FIG. 6.

Next, a method for fabricating an LCD using an etchant according to an embodiment of the present invention will be described. First, a method for fabricating a TFT plate will be described with reference to FIGS. 3 through 7. FIG. 3 is a layout of a thin film transistor (TFT) plate of an LCD fabricated according to an embodiment of the present invention. FIGS. 4 and 5 are cross-sectional views taken along lines IVa-IVa' and IVb-IVb' of FIG. 3. FIG. 6 is a layout of a TFT plate at a stage following FIG. 5. FIG. 7 is a cross-sectional view taken along VIIa-VIIa' and VIIb-VIIb' of FIG. 6. As shown in FIGS. 3 and 4, a conductive layer for a gate wiring is formed on the first substrate 110. The conductive layer for a gate wiring may have a single-layered structure comprising aluminum based metal such as aluminum (Al) or an aluminum alloy or a multi-layered structure (not shown) comprising chrome (Cr), titanium (Ti), tantalum (Ta), molybdenum (Mo), and an alloy thereof that have superior physical, chemical, and electrical contact characteristics with respect to other materials such as ITO or IZO. The conductive layer for a gate wiring is patterned to form the gate wiring including the gate line 121 extending in a transverse direction, the gate electrode 123, the gate pad 125, and the two storage electrodes 133a and 133b that are connected to the storage electrode line 131 formed in parallel with the gate line 121 and are connected to each other by the horizontal storage electrode 133c.

Next, the gate insulating layer 140 formed of silicon nitride, an intrinsic amorphous silicon layer, and a doped amorphous silicon layer are continuously deposited using, for example, a chemical vapor deposition (CVD) method. Photolithography is performed on the intrinsic amorphous silicon layer and the doped amorphous silicon layer to form the channel portion semiconductor layer 151 on the gate insulating layer 140 on the gate electrode 123, the data line semiconductor layer 153 that connects the channel portion semiconductor layer 151, and the ohmic contact layer 161 on the semiconductor layers 151 and 153 for reducing contact resistance between the source electrode 173 and the drain electrode 175 and the channel portion semiconductor layer 151. Here, the data pad ohmic contact layer 162 is also formed. A conductive layer for a data wiring is formed on the gate insulating layer 140. The conductive layer for a data wiring may have a single-layered structure comprising aluminum based metal such as aluminum (Al) or an aluminum alloy or a multi-layered structure (not shown) comprising chrome (Cr), titanium (Ti), tantalum (Ta), molybdenum (Mo), and an alloy thereof that have superior physical, chemical, and electrical contact characteristics with respect to other materials such as ITO or IZO. Next, the conductive layer for a data wiring is patterned to form a data wiring including data line 171 that intersects the gate line 121, the source electrode 173 that is connected to the data line 171 and extends onto the gate electrode 123, the data pad 179 that is connected to an end of the data line 171, and the drain electrode 175 that is separated from the source electrode 173 and is located in opposition to the source electrode 173 in view of the gate electrode 123 and to form the bridge portion metal element 172 that overlaps with the gate line 121.

The data wiring including the data line 171, the source electrode 173, the data electrode 175, and the data pad 179 are separated to both sides of the gate electrode 123 by etching portions of an ohmic contact layer that are not covered by the data wiring, and a portion of the semiconductor layer 151 between the ohmic contact layers 163 and 165 is exposed. Here, it is desirable to perform oxygen plasma processing to stabilize the surface of the exposed portion of the semiconductor layer 151. ext, the passivation layer 180 is formed by depositing an inorganic insulating layer such as silicon nitride or applying an organic insulating layer such as an acryl based material. The gate insulating layer 140 and the passivation layer 180 are patterned through photolithography to form the contact holes 181, 182, and 183 that expose the gate pad 125, the drain electrode 175, and the data pad 179. Here, the contact holes 181, 182, and 183 may take angular or circular shapes. The area of each of the contact holes that expose the gate pad 125 and the data pad 179 does not exceed 2 mm×60 μm, e.g., may be greater than 0.5 mm×15 μm. The contact holes used for the storage wiring connection bridge 91 to contact the storage electrode line 131 and the storage electrodes 133a, 133b, and 133c are also formed at this stage.

Next, as shown in FIG. 5, the transparent conductive oxide layer 185 is formed of indium oxide such as ITO or IZO. For example, when the transparent conductive oxide layer 185 is formed of ITO using a sputtering method, sputtering may be performed at about 150° C. or less, e.g., at room temperature. At such temperature, a conductive oxide material including ITO cannot be crystallized, i.e., can take an amorphous form. Before the transparent conductive oxide layer 185 is formed, pre-heating is performed under a nitrogen tmosphere to prevent a metal oxide layer from being formed on a metal layer exposed by the contact holes 181, 182, and 183. Next, a photoresist layer is deposited on the transparent conductive oxide layer 185 and is then patterned as desired, thereby forming a photoresist layer pattern 200.

As shown in FIGS. 6 and 7, by using the photoresist layer pattern 200 on the transparent conductive oxide layer 185 as an etching mask, the pixel electrodes 190 having the cutouts 191, 192, and 193 connected to the drain electrode 175 through the first contact hole 181, the auxiliary gate pad 95 connected to the gate pad 125 through the second contact hole 182, and the auxiliary data pad 97 connected to the data pad 179 through the third contact hole 183 are formed. The storage wiring connection bridge 91 is also formed at this stage. For patterning the transparent conductive oxide layer 185, an etchant including 2-15 wt % sulfuric acid as a main oxidizer, 0.02-10 wt % hydrogen sulfate of alkali metal for providing superior etching capability with respect to a transparent conductive oxide layer while preventing damage to an underlying layer, i.e., the storage wiring, the drain electrode, the gate pad, and the data pad, a 0.02-10 wt % auxiliary oxidizer for aiding in the role of sulfuric acid, a 0.01-5 wt % auxiliary inhibitor for aiding in the role of hydrogen sulfate of alkali metal, and deionized water as the remainder may be used. Here, potassium hydrogen sulfate may be used as hydrogen sulfate of alkali metal. The auxiliary oxidizer may be a compound of at least one selected from the group consisting of, e.g., phosphoric acid ($H_3PO_4$), nitric acid ($HNO_3$), acetic acid ($CH_3COOH$), perchloric acid ($HClO_4$), hydrogen peroxide ($H_2O_2$), and oxone. The auxiliary inhibitor may be a compound of at least one selected from the group consisting of, e.g., ammonium salts, i.e., $CH_3COONH_4$, $NH_4SO_3NH_2$, $NH_4C_6H_5O_2$, $NH_4COONH_4$, $NH_4Cl$, $NH_4H_2PO_4$, $NH_4OOCH$, $NH_4HCO_3 H_4NO_2CCH_2C(OH)(CO_2NH_4)CH_2CO_2NH_4$, $NH_4PF_6$, $HOC(CO_2H)(CH_2CO_2NH_4)_2$, $NH_4NO_3$, $(NH_4)_2S_2O_8$, $H_2NSO_3NH_4$, and $(NH_4)_2SO_4$. The deionized water may have a resistivity of 18 MΩ/cm in a state where ions are removed from water. The auxiliary oxidizer and the auxiliary inhibitor may not be contained in the etchant and other additives for improving etching performance may be further contained in the etchant.

An etching process for patterning the transparent conductive oxide layer 185 using the etchant may be performed by spraying the etchant onto the surface of the transparent conductive oxide layer 185 on which the photoresist layer pattern 200 is formed. The etching temperature may be maintained within a range of 30-50° C. An etching time may be determined by using an end point detector (EPD). For example, the etching time may be about 20-100 seconds, preferably about 60-100 seconds.

Figure 8:
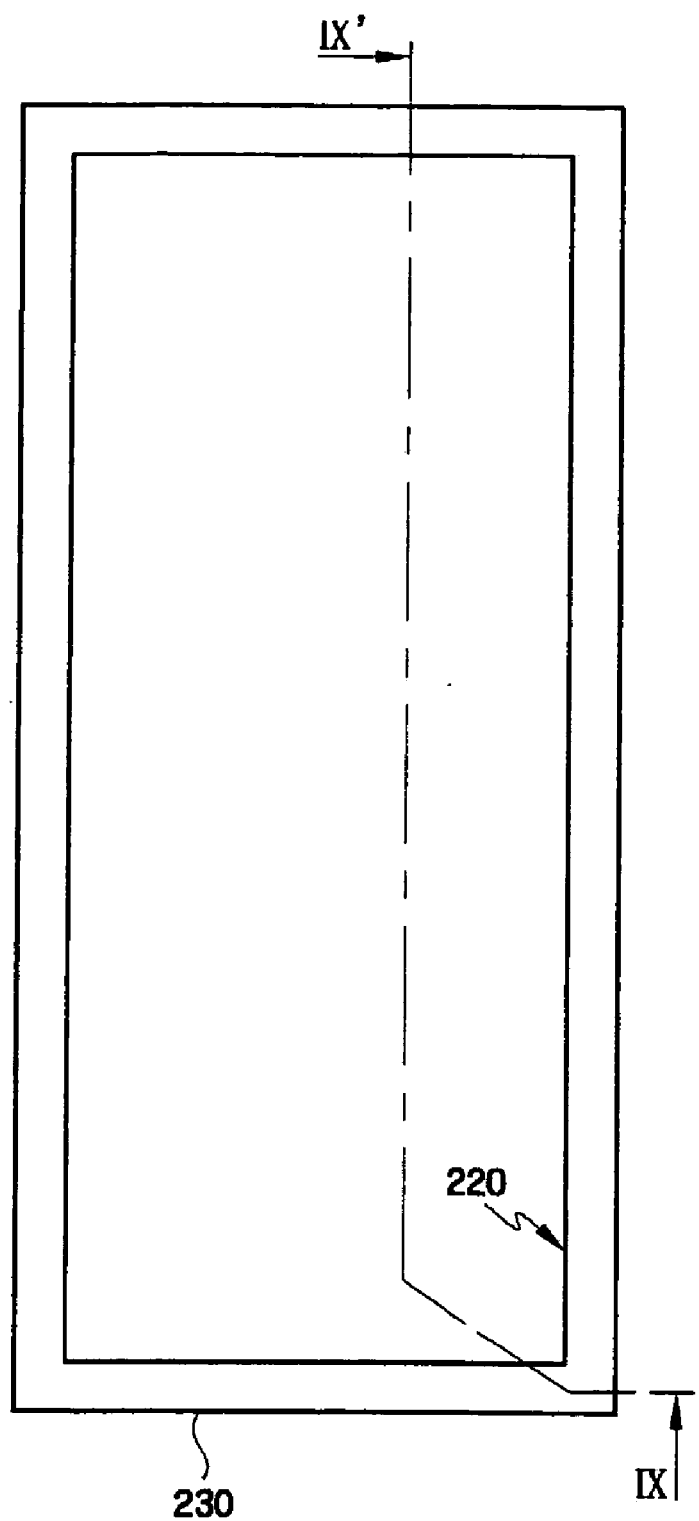
FIG. 8 is a layout of a color filter plate of an LCD fabricated according to an embodiment of the present invention.
Figure 9:
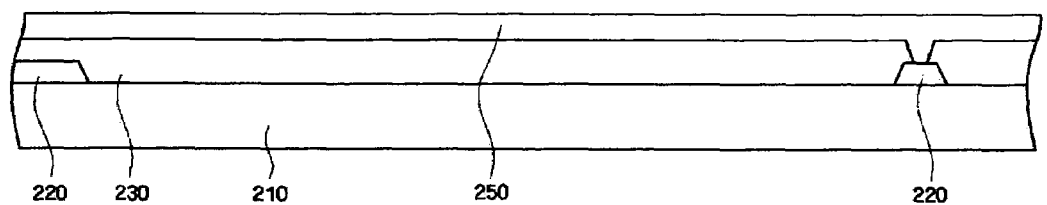
FIGS. 9 and 10 are cross-sectional views taken along the line IX-IX' of FIG. 8.
Figure 10:
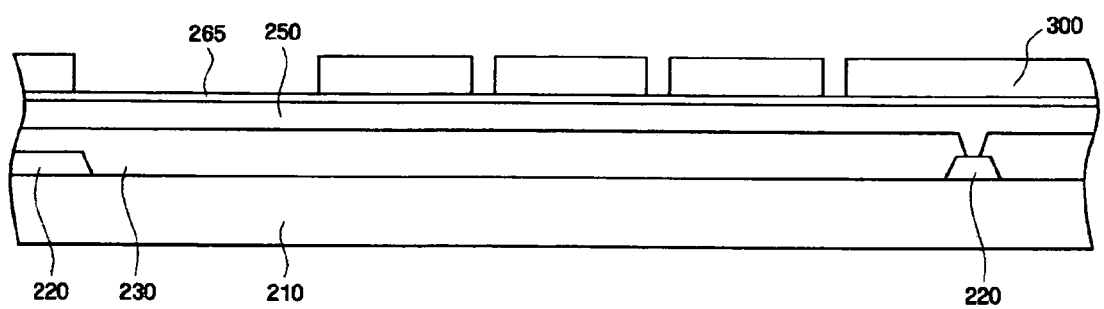
Figure 11:
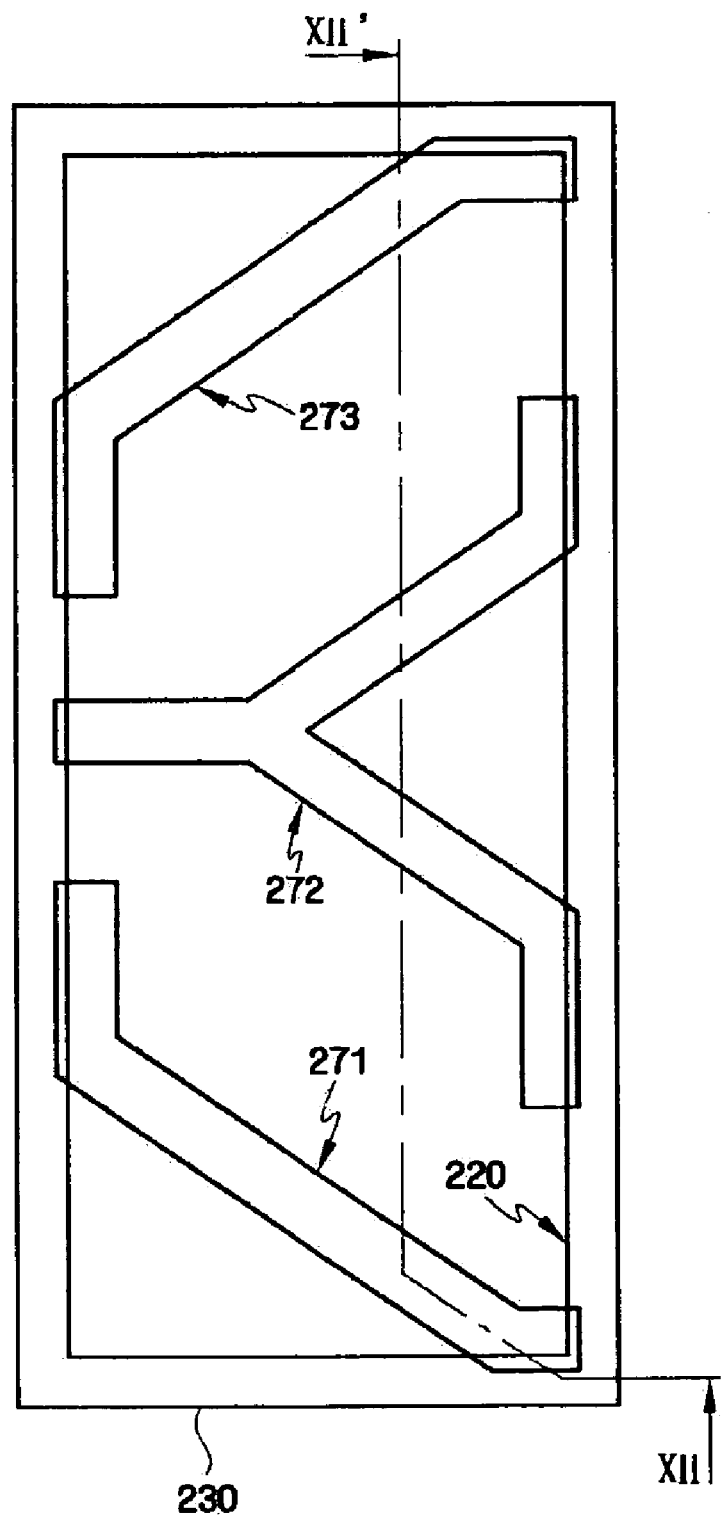
FIG. 11 is a layout of a color filter plate at a stage following FIG. 8.
Figure 12:
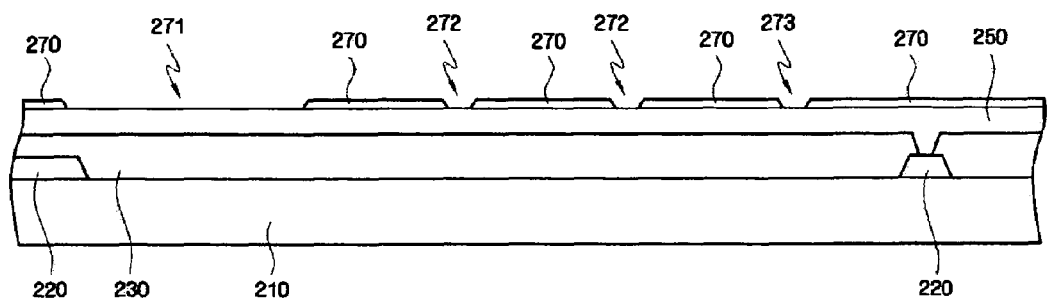
FIG. 12 is a cross-sectional view taken along the line XII-XII' of FIG. 11.

FIG. 8 is a layout of a color filter plate of an LCD fabricated according to an embodiment of the present invention, FIGS. 9 and 10 are cross-sectional views taken along the line IX-IX' of FIG. 8, FIG. 11 is a layout of a color filter plate at a stage following FIG. 8, and FIG. 12 is a cross-sectional view taken along the line XII-XII' of FIG. 11. As shown in FIGS. 8 and 9, after a light transmitting region of the insulating substrate 210 in which an image is displayed and a light blocking region for blocking light are defined, a black photoresist layer comprising a black photosensitive material is applied using, for example, a slit coating process or a spin coating process. Here, the black photoresist layer includes positive photoresist whose exposed portion is removed by development and negative photoresist whose exposed portion remains. The applied black photoresist layer is exposed to ultraviolet (UV) rays using a mask. Here, molecular bonding of a black photosensitive material to which the UV rays are irradiated is broken and the amount of molecules of the black photosensitive material in the light transmitting region is reduced. A black photosensitive material of the light blocking region to which the UV rays are not transmitted maintains a molecular state. The black photoresist layer is then developed. The black photoresist layer having a reduced amount of molecules due to development is removed, thereby forming the black matrix 220 existing only in the light blocking region. The color filter 230 is formed on the insulating substrate 210 in which the black matrix 220 is formed. The color filter 230 selectively filters light of a specific wavelength. For example, the color filter 230 is formed by applying a photosensitive material including a pigment, exposing and then developing the resultant structure. Here, the black matrix 220 may be formed after the color filter 230 is first formed. ext, a transparent organic material is applied onto the insulating substrate 220 in which the color filter 230 is formed, thereby forming the overcoat layer 250. The overcoat layer 250 is used to remove a step of the black matrix 220 and the color filter 230.

As shown in FIG. 10, a transparent conductive material, i.e., a transparent conductive oxide layer 265, is formed of indium oxide such as ITO or IZO on the entire surface of the overcoat layer 250. A process of forming the transparent conductive oxide layer 265 is the same as that in the method for fabricating the TFT plate, an explanation thereof will not be given. When the transparent conductive oxide layer 265 is formed of ITO, amorphous or crystalline ITO may be used and, for example, amorphous ITO may be used. Next, a photoresist layer is deposited on the transparent conductive oxide layer 185 and is then patterned as desired, thereby forming a photoresist layer pattern 300.

Next, as shown in FIGS. 11 and 12, the common electrode 270 having the cutouts 271, 272, and 273 is formed using the photoresist layer pattern 300 on the transparent conductive oxide layer 250 as an etching mask. An etchant used for patterning the transparent conductive oxide layer 265 includes 2-15 wt % sulfuric acid, 0.02-10 wt % hydrogen sulfate of alkali metal, a 0.02-10 wt % auxiliary oxidizer, a 0.01-5 wt % auxiliary inhibitor, and deionized water as the remainder. The etchant is the same as that used in forming the pixel electrodes of the TFT plate and an explanation thereof will not be given. An etching process for patterning the transparent conductive oxide layer 265 using the etchant may be performed by spraying the etchant onto the surface of the transparent conductive oxide layer 265 in which the photoresist layer pattern 300 is formed. Here, an etching temperature may be maintained at about 30-50° C. An etching time may be, for example, about 20-100 seconds, preferably 60-100 seconds. Next, referring back to FIGS. 1 and 2, after the TFT plate and the color filter plate are arranged, liquid crystals 3 are injected between the TFT plate and the color filter plate. Alternatively, after the liquid crystals 3 are dropped onto one of the TFT plate and the color filter plate, the TFT plate and the color filter plate are arranged. Although a vertical alignment (VA)-mode LCD including cutouts in field generating electrodes is taken as an example and a fabrication method thereof is described, the present invention can also be applied to a method for fabricating various-mode LCDs formed by patterning a transparent conductive oxide layer formed of a transparent conductive oxide material, i.e., indium oxide.

Hereinafter, the present invention will be described in more detail using experiment examples and comparison examples. However, it should be understood that the following experiment examples are only used as examples for the present invention and the present invention is not limited by the following experiment examples. First, the following experiment is carried out to measure the etching rate of an etchant according to an embodiment of the present invention with respect to indium oxide materials.

EXPERIMENTAL EXAMPLE 1

After 8 wt % sulfuric acid ($H_2SO_4$), 5 wt % potassium hydrogen sulfate ($KHSO_4$), and 5 wt % perchloric acid ($HClO_4$), which are all within grade ranges suitable for semiconductor processing, are mixed and a 25 ppm additive (FT-248 from Bayer) is added to the mixture, deionized water is added such that a total amount of an etchant becomes 100 wt %, thereby fabricating the etchant. The etchant is sprayed onto an insulating substrate in which an IZO layer is formed to a thickness of 1100 Å and a predetermined photoresist layer pattern is formed on the IZO layer, thereby patterning the IZO layer. Here, the etching process is performed at 40° C. for 20 seconds. The result is shown in Table 1.

EXPERIMENTAL EXAMPLE 2

Patterning is performed in the same way as Experimental Example 1 except that the etchant is sprayed onto an insulating substrate in which an amorphous ITO layer is formed to a thickness of 550 Å and a predetermined photoresist layer pattern is formed on the amorphous ITO layer. The result is shown in Table 1.

COMPARATIVE EXAMPLE 1

An etchant is prepared by mixing 5 wt % oxalic acid and 95 wt % deionized water. The etchant is sprayed onto an insulating substrate in which an IZO layer is formed to a thickness of 1100 Å and a predetermined photoresist layer pattern is formed on the IZO layer, thereby patterning the IZO layer. Here, the etching process is performed at 40° C. for 20 seconds. The result is shown in Table 1.

COMPARATIVE EXAMPLE 2

Patterning is performed in the same way as Comparative Example 1 except that the etchant is sprayed onto an insulating substrate in which an amorphous ITO layer is formed to a thickness of 550 Å and a predetermined photoresist layer pattern is formed on the amorphous ITO layer. The result is shown in Table 1.

COMPARATIVE EXAMPLE 3

After 8 wt % sulfuric acid ($H_2SO_4$), 7 wt % nitric acid ($HNO_3$), and 1 wt % ammonium acetate, which are all within grade ranges suitable for semiconductor processing, are mixed and a 25ppm additive (FT-248 from Bayer) is added to the mixture, deionized water is added such that a total amount of an etchant becomes 100 wt %, thereby fabricating the etchant. The etchant is sprayed onto an insulating substrate in which an amorphous ITO layer is formed to a thickness of 550 Å and a predetermined photoresist layer pattern is formed on the amorphous ITO layer, thereby patterning the amorphous ITO layer. Here, the etching process is performed at 40° C. for 20 seconds. The results are shown in Table 1.

TABLE 1

| | Experiment Example 1 | Experiment Example 2 | Comparison Example 1 | Comparison Example 2 | Comparison Example 3 |
|---|---|---|---|---|---|
| Etching rate (Å/min) | 1510 | 992 | 881 | 639 | 576 |

As shown in Table 1, when Experimental Example 1 where the IZO layer is patterned using the etchant according to an embodiment of the present invention and Comparative Example 1 where the IZO layer is patterned using the etchant including oxalic acid are compared in terms of their etching rates, it can be seen that the etching rate of Experimental Example 1 is higher than that of Comparative Example 1 by about 71%. When Experimental Example 2 where the amorphous ITO layer is patterned using the etchant according to an embodiment of the present invention and Comparative Example 2 where the amorphous ITO layer is patterned using the etchant including oxalic acid are compared in terms of their etching rates, it can be seen that the etching rate of Experimental Example 2 is higher than that of Comparative Example 2 by about 55%. When Experimental Example 2 and Comparative Example 3 where the amorphous ITO is patterned using the etchant having no hydrogen sulfate of alkali metal are compared, it can be seen that the etching rate of Experimental Example 2 is higher than that of Comparative Example 3 by about 72%.

To check if a metal layer is damaged by the etchant according to an embodiment of the present invention, the following experiment is carried out.

EXPERIMENTAL EXAMPLE 3

Figure 13:
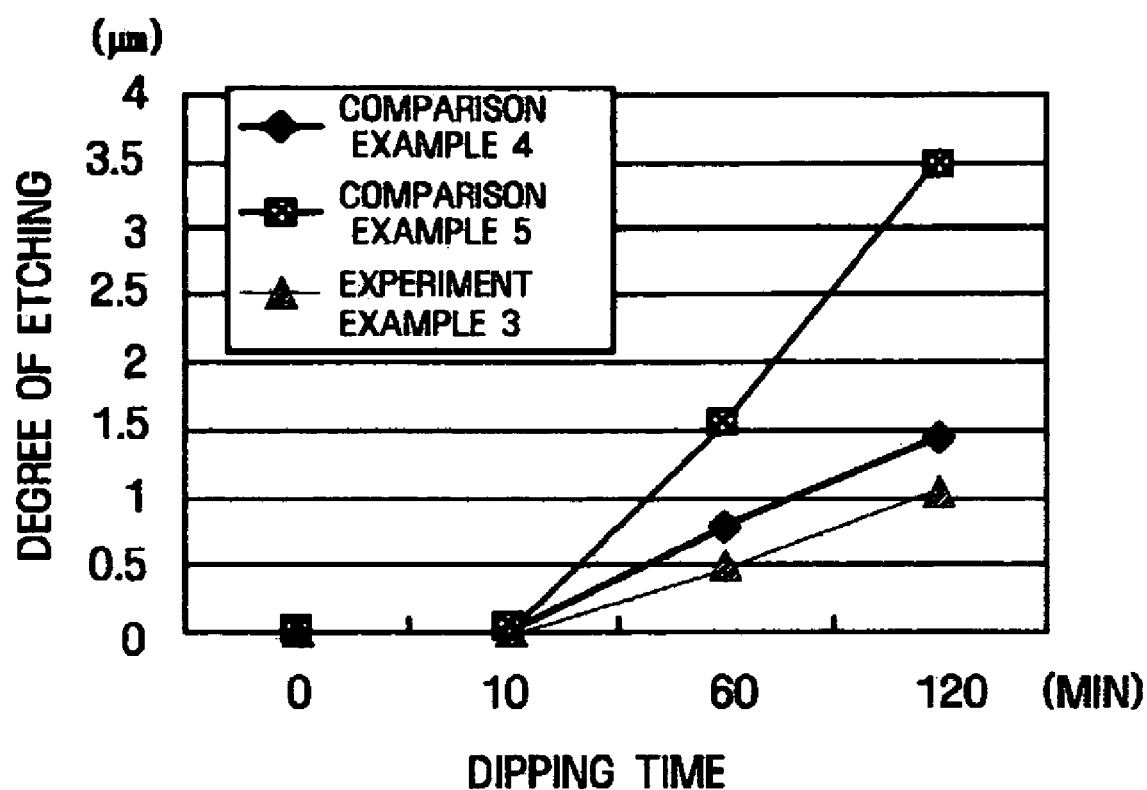
FIG. 13 is a graph showing a result of experimenting damage to a metal layer, caused by an etchant according to an embodiment of the present invention.

An insulating substrate in which an aluminum (Al) layer is formed to a thickness of 0.2 μm is dipped into the etchant that is the same as in Experimental Example 1, and the degree of damage of the aluminum layer is observed. Here, an etching temperature is about 40° C. The result is as shown in FIG. 13.

COMPARATIVE EXAMPLE 4

An insulating substrate in which an aluminum (Al) layer is formed to a thickness of 0.2 μm is dipped into the etchant that is the same as in Comparative Example 1, and the degree of damage of the aluminum layer is observed. Here, an etching temperature is about 40° C. The result is as shown in FIG. 13.

COMPARATIVE EXAMPLE 5

An insulating substrate in which an aluminum (Al) layer is formed to a thickness of 0.2 μm is dipped into the etchant that is the same as in Comparative Example 3, and the degree of damage of the aluminum layer is observed. Here, an etching temperature is about 40° C. The result is as shown in FIG. 13. As shown in FIG. 13, in Experimental Example 3 and Comparative Examples 4 and 5, the aluminum layer is not etched for 10 minutes and the degree of etching of the aluminum layer increases over time after 10 minutes has passed. The degree of etching is largest in Comparative Example 5 and is smallest in Experimental Example 3. Thus, the experiment results demonstrate that the etchant according to an embodiment of the present invention causes a little damage to a metal layer. In addition, it can be seen that the etchant according to an embodiment of the present invention provides superior etching performance with respect to a transparent conductive oxide layer formed of indium oxide while causing a little damage to a metal layer that is lower than the transparent conductive oxide layer, thereby being effectively used for patterning the transparent conductive oxide layer as desired.

As described above, when an LCD is fabricated by patterning a transparent conductive oxide layer formed of indium oxide using the etchant according to an embodiment of the present invention, patterning can be performed using the etchant regardless of whether indium oxide is crystalline or amorphous ITO and IZO. Moreover, since the etchant according to an embodiment of the present invention has superior etching performance with respect to the transparent conductive oxide layer and causes a little damage to an underlying layer, LCD fabricating efficiency can be improved.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. An etchant for a transparent conductive oxide layer comprising:
   2-15 wt % sulfuric acid;
   0.02-10 wt % hydrogen sulfate of an alkali metal; and
   deionized water as the remainder,
   wherein the transparent conductive oxide layer is made of indium tin oxide (ITO) or indium zinc oxide (IZO).

2. The etchant of claim 1, wherein the hydrogen sulfate of an alkali metal includes $KHSO_4$.

3. The etchant of claim 2, further comprising a 0.02-10 wt % auxiliary oxidizer.

4. The etchant of claim 3, wherein the auxiliary oxidizer is a compound of at least one selected from the group consisting of $H_3PO_4$, $HNO_3$, $CH_3COOH$, $HClO_4$, $H_2O_2$, and oxone.

5. The etchant of claim 1, wherein the hydrogen sulfate of an alkali metal includes $KHSO_4$, further comprising a 0.02-10 wt % auxiliary oxidizer, further comprising a 0.01-5 wt % auxiliary inhibitor.

6. The etchant of claim 5, wherein the auxiliary oxidizer is a compound of at least one selected from a group consisting of $H_3PO_4$, $HNO_3$, $CH_3COOH$, $HClO_4$, $H_2O_2$, and oxone.

7. The etchant of claim 5, wherein the auxiliary inhibitor is a compound of at least one selected from the group consisting of $CH_3COONH_4$, $NH_4SO_3NH_2$, $NH_4C_6H_5O_2$, $NH_4COONH_4$, $NH_4Cl$, $NH_4H_2PO_4$, $NH_4OOCH$, $NH_4HCO_3$, $H_4NO_2CCH_2C(OH)(CO_2NH_4)CH_2CO_2NH_4$, $NH_4PF_6$, $HOC(CO_2H)(CH_2CO_2NH_4)_2$, $NH_4NO_3$, $(NH_4)_2S_2O_8$, $H_2NSO_3NH_4$, and $(NH_4)_2SO_4$.

8. The etchant of claim 1, wherein the hydrogen sulphate of an alkali metal includes $KHSO_4$, further comprising 0.01-5 wt % auxiliary inhibitor.

9. The etchant of claim 8, wherein the auxiliary inhibitor is a compound of at least one selected from the group consisting of $CH_3COONH_4$, $NH_4SO_3NH_2$, $NH_4C_6H_5O_2$, $NH_4COONH_4$, $NH_4Cl$, $NH_4H_2PO_4$, $NH_4OOCH$, $NH_4HCO_3$, $H_4NO_2CCH_2C(OH)(CO_2NH_4)CH_2CO_2NH_4$, $NH_4PF_6$, $HOC(CO_2H)(CH_2CO_2NH_4)_2$, $NH_4NO_3$, $(NH_4)_2S_2O_8$, $H_2NSO_3NH_4$, and $(NH_4)_2SO_4$.

10. The etchant of claim 1, further comprising a 0.02-10 wt % auxiliary oxidizer.

11. The etchant of claim 10, wherein the auxiliary oxidizer is a compound of at least one selected from the group consisting of $H_3PO_4$, $HNO_3$, $CH_3COOH$, $HClO_4$, $H_2O_2$, and oxone.

12. The etchant of claim 1, further comprising a 0.02-10 wt % auxiliary oxidizer, further comprising a 0.01-5 wt % auxiliary inhibitor.

13. The etchant of claim 12, wherein the auxiliary oxidizer is a compound of at least one selected from the group consisting of $H_3PO_4$, $HNO_3$, $CH_3COOH$, $HClO_4$, $H_2O_2$, and oxone.

14. The etchant of claim 12, wherein the auxiliary inhibitor is a compound of at least one selected form the group consisting of $CH_3COONH_4$, $NH_4SO_3NH_2$, $NH_4C_6H_5O_2$, $NH_4COONH_4$, $NH_4Cl$, $NH_4H_2PO_4$, $NH_4OOCH$, $NH_4HCO_3$, $H_4NO_2CCH_2C(OH)(CO_2NH_4)CH_2CO_2NH_4$, $NH_4PF_6$, $HOC(CO_2H)(CH_2CO_2NH_4)_2$, $NH_4NO_3$, $(NH_4)_2S_2O_8$, $H_2NSO_3NH_4$, and $(NH_4)_2SO_4$.

15. The etchant of claim 1, further comprising a 0.01-5 wt % auxiliary inhibitor.

16. The etchant of claim 15, wherein the auxiliary inhibitor is a compound of at least one selected from the group consisting of $CH_3COONH_4$, $NH_4SO_3NH_2$, $NH_4C_6H_5O_2$, $NH_4COONH_4$, $NH_4Cl$, $NH_4H_2PO_4$, $NH_4OOCH$, $NH_4HCO_3$, $H_4NO_2CCH_2C(OH)(CO_2NH_4)CH_2CO_2NH_4$, $NH_4PF_6$, $HOC(CO_2H)(CH_2CO_2NH_4)_2$, $NH_4NO_3$, $(NH_4)_2S_2O_8$, $H_2NSO_3NH_4$, and $(NH_4)_2SO_4$.

17. The etchant of claim 1, wherein the indium tin oxide (ITO) is amorphous indium tin oxide (ITO).

18. An etchant for a transparent conductive oxide layer, comprising:
  2-15 wt % sulfuric acid;
  0.02-10 wt % hydrogen sulfate of alkali metal;
  a 0.02-10 wt % auxiliary oxidizer;
  a 0.01-5 wt % auxiliary inhibitor; and
  deionized water as the remainder,
  wherein the transparent conductive oxide layer is made of indium tin oxide (ITO) or indium zinc oxide (IZO).

19. The etchant of claim 18, wherein hydrogen sulfate of alkali metal includes $KHSO_4$.

20. The etchant of claim 18, wherein the auxiliary oxidizer is a compound of at least one selected from the group consisting of $H_3PO_4$, $HNO_3$, $CH_3COOH$, $HClO_4$, $H_2O_2$, and oxone.

21. The etchant of claim 18, wherein the auxiliary inhibitor is a compound of at least one selected from the group consisting of $CH_3COONH_4$, $NH_4SO_3NH_2$, $NH_4C_6H_5O_2$, $NH_4COONH_4$, $NH_4Cl$, $NH_4H_2PO_4$, $NH_4OOCH$, $NH_4HCO_3$, $H_4NO_2CCH_2C(OH)(CO_2NH_4)CH_2CO_2NH_4$, $NH_4PF_6$, $HOC(CO_2H)(CH_2CO_2NH_4)_2$, $NH_4NO_3$, $(NH_4)_2S_2O_8$, $H_2NSO_3NH_4$, and $(NH_4)_2SO_4$.

22. The etchant of claim 18, wherein the indium tin oxide (ITO) is amorphous indium tin oxide (ITO).

23. A method for fabricating a liquid crystal display (LCD), the method comprising:
  providing an insulating substrate in which a transparent conductive oxide layer is formed; and
  patterning the transparent conductive oxide layer by etching the transparent conductive oxide layer using the etchant of one of claims 1 to 14.

24. The method of claim 23, wherein the etching is performed at 30-50° C.

25. The method of claim 23, wherein the etching is performed for 20-100 seconds.

26. The method of claim 23, wherein the transparent conductive oxide layer is made of indium tin oxide (ITO) or indium zinc oxide (IZO).

27. The method of claim 26, wherein the indium tin oxide (ITO) is amorphous indium tin oxide (ITO).

* * * * *